(12) United States Patent
Rodrigues et al.

(10) Patent No.: US 10,371,735 B2
(45) Date of Patent: Aug. 6, 2019

(54) METHOD AND SYSTEM FOR MONITORING ELECTRICAL ISOLATION

(71) Applicant: Deere & Company, Moline, IL (US)

(72) Inventors: Olsen A. Rodrigues, West Fargo, ND (US); Neal D. Clements, Sheldon, ND (US); Kent D. Wanner, Fargo, ND (US)

(73) Assignee: DEERE & COMPANY, Moline, IL (US)

( * ) Notice: Subject to any disclaimer, the term of this patent is extended or adjusted under 35 U.S.C. 154(b) by 356 days.

(21) Appl. No.: 14/941,740

(22) Filed: Nov. 16, 2015

(65) Prior Publication Data

US 2017/0138995 A1 May 18, 2017

(51) Int. Cl.
G01R 31/02 (2006.01)
(52) U.S. Cl.
CPC ................. *G01R 31/025* (2013.01)
(58) Field of Classification Search
CPC ........................................... G01R 31/025–026
See application file for complete search history.

(56) References Cited

U.S. PATENT DOCUMENTS

| | | | |
|---|---|---|---|
| 6,952,103 B2 | 10/2005 | Herb et al. | |
| 7,576,547 B2 | 8/2009 | Müller | |
| 7,592,815 B2 * | 9/2009 | Yano | B60L 3/0046 320/116 |
| 2012/0221269 A1 | 8/2012 | Wanner et al. | |
| 2013/0027049 A1 | 1/2013 | Sukup | |

OTHER PUBLICATIONS

Search Report issued in counterpart application No. GB1616394.1, dated Feb. 21, 2017 (3 pages).

* cited by examiner

*Primary Examiner* — Minh Q Phan

(57) ABSTRACT

A first voltage sensor measures a primary voltage between a first terminal of a tested device and electrical ground when a first switch and a second switch are in various on states or off states. In a test state either the first switch or the second switch is in an on state and in reference state both the first switch and the second switch are in on states. An observed leakage resistance is estimated based on the measured primary and secondary voltages of the test state. A reference leakage resistance is based on the measured primary and secondary voltages of the reference state. A test circuit has failed if the observed leakage resistance differs from the reference leakage resistance by more than a threshold amount.

21 Claims, 8 Drawing Sheets

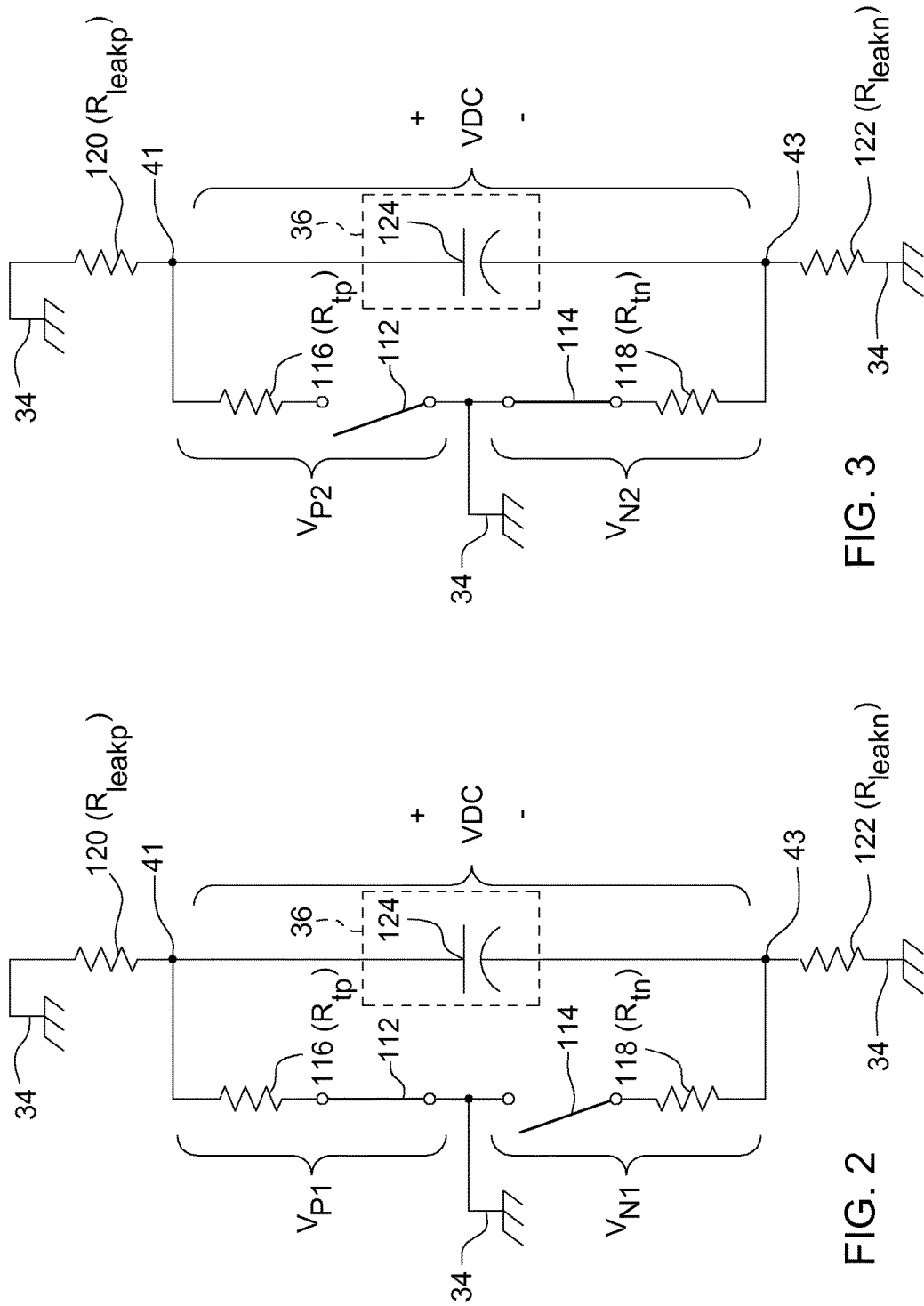

METHOD AND SYSTEM FOR MONITORING ELECTRICAL ISOLATION

FIELD

This disclosure relates to a method and system for monitoring electrical isolation, such isolation between a terminal and electrical ground of a tested device.

BACKGROUND

In certain prior art, a monitoring system monitors the isolation or electrical resistance between a terminal and electrical ground by a test switch switching a known resistance value (e.g., high resistance to limit current) between the electrical terminal and electrical ground to measure voltage across or current through the known resistance value. For example, the electrical terminal may represent a positive direct current terminal or a negative direct current terminal of a tested device, where the electrical terminal is not directly connected to electrical ground or chassis ground. In some prior art, a first test switch is placed in series with a first test resistor and a second test switch is placed in series with a second test resistor, where the first switch and the second switch are sequentially activated to test isolation between a first terminal (e.g., positive direct current terminal) and ground and isolation between a second terminal (e.g., negative direct current terminal) and ground. However, if the first switch or the second switch fails in a shorted state, the leakage resistance between one electrical terminal and electrical ground will appear to be low, providing a false positive of a lack of isolation or improper leakage resistance in the tested device. Accordingly, there is need for a method and system for monitoring electrical isolation that can differentiate between a truly low leakage resistance or determine whether there is a fault in the test circuit.

SUMMARY

In accordance with one embodiment, a first voltage sensor measures a primary voltage between a first terminal of a tested device and electrical ground when a first switch and a second switch are in various combinations of on and off states. In a test state either the first switch or the second switch is in an on state and in a reference state both the first switch and the second switch are in on states. An observed leakage resistance is estimated based on the measured primary and secondary voltages of the test state. A reference leakage resistance is based on the measured primary and secondary voltages of the reference state. A test circuit has failed if the observed leakage resistance differs from the reference leakage resistance by more than a threshold amount.

BRIEF DESCRIPTION OF THE DRAWINGS

FIG. 2 is one embodiment of a schematic for a test circuit that shows a first state or separate time interval where a first switch is on and a second switch is off.

FIG. 3 is one embodiment of a schematic for a test circuit that shows a second state or a discrete time interval where a first switch is off and a second switch is on.

FIG. 4 is one embodiment of a schematic for a test circuit that shows a third state or a compound time interval where a first switch is on and a second switch is on.

DETAILED DESCRIPTION

Figure 1:
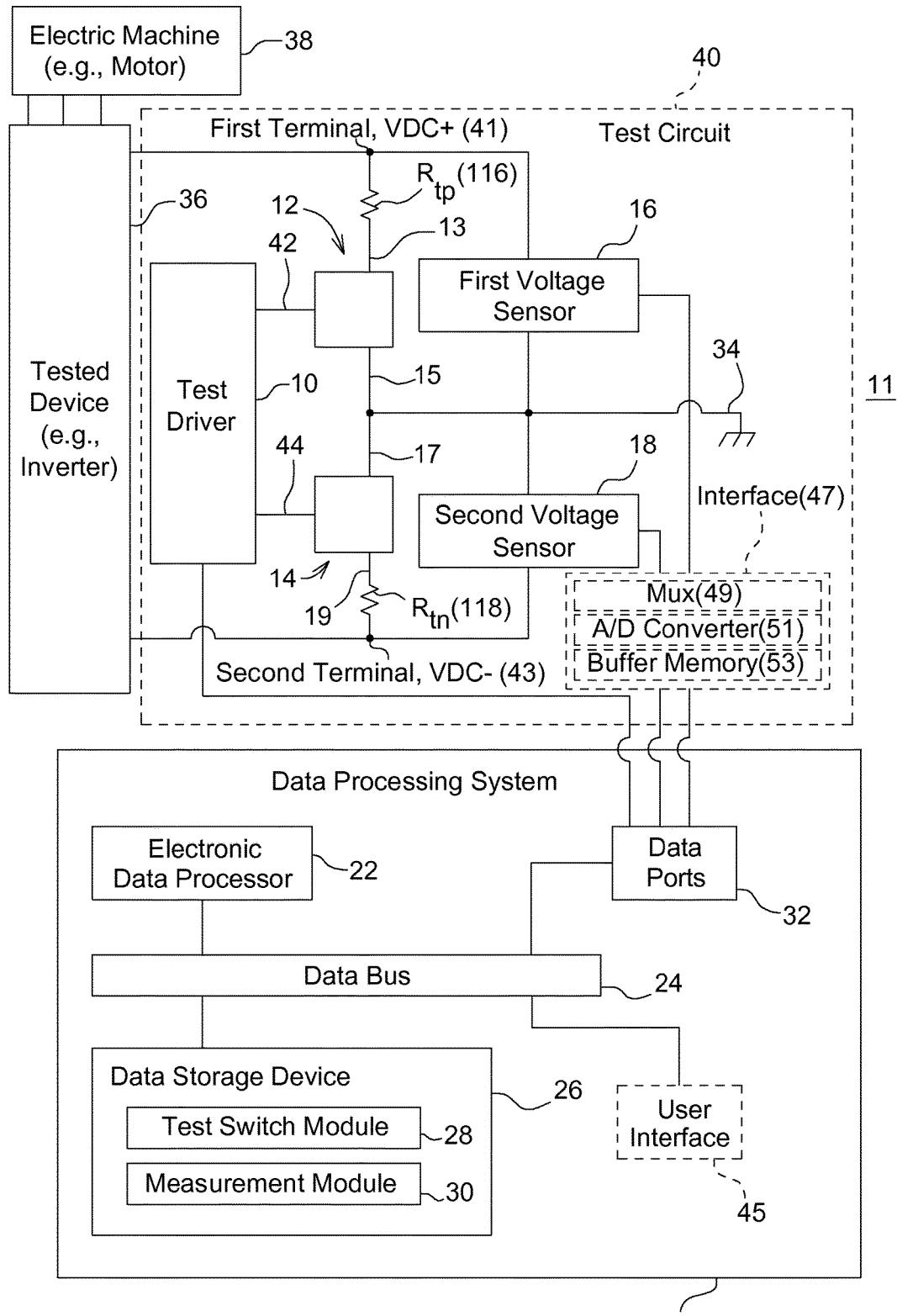
FIG. 1 is one embodiment of a block diagram a test circuit for monitoring electrical isolation, such as isolation between a terminal of a tested device and electrical ground.

FIG. 1 is one embodiment of a block diagram of a system 11 for monitoring electrical isolation, such as isolation between a terminal of a tested device 36 and electrical ground 34, where faults, short circuits, open circuits, or variation from normal operational resistance or impedance in the test circuit 40 can be detected reliably. The system 11 is capable of reliably detecting faults, short circuits, or open circuits in the test circuit 40, which may arise from faults, direct shorts, or open circuits in one or more test switches (12, 14) or test resistors (116, 118). The system 11 comprises a test circuit 40 that is coupled to an electronic data processing system 20. The system 11 is arranged to test isolation or leakage resistance in a tested device 36, such as an inverter, power electronics device, battery, or controller for an electric machine 38 (e.g., motor or generator). Isolation means the isolation or insulation between an electric terminal (e.g., 41, 43) of the tested device 36 and electrical ground 34 (e.g., chassis of a vehicle or the tested device 36). Isolation can be measured in terms of resistance, reactance or impedance between the electrical terminal of the tested device 36 and electrical ground 34. Here, the tested device 36 has electrical terminals (e.g., 41, 43) that are not directly connected or coupled to ground 34. Accordingly, the tested device 36 has terminals (e.g., 41, 43) that may be characterized as floating with respect to ground 34 during normal or proper operation of the tested device 36.

In certain embodiments, the electrical terminals (e.g., 41, 43) of the tested device 36 may comprise terminals of opposite polarity, such as a negative direct current terminal and a positive direct current terminal. However, in other embodiments, the electrical terminals of the test device may comprise terminals of the same polarity, but that have a differential potential between the terminals. As shown in FIG. 1, the first switch 12 and the second switch 14 are consistent with electrical terminals of the tested device 36 of opposite polarity; the switches can be modified to address other differential potentials between the terminals of the tested device 36. During operation of a tested device, such as an inverter, the system and method of this disclosure can detect the faults (e.g., short circuit to ground) of the electrical cables (e.g., alternating current phases) that are connected between an inverter and an electric machine.

In one embodiment, the test circuit 40 comprises a test driver 10 that is coupled to the control terminals (42, 44) of the first switch 12 and the second switch 14. As illustrated in FIG. 1, the first switch 12 comprises a first semiconductor and the second switch 14 comprises a second semiconductor. For example, the first switch 12 may comprise a first transistor or first field-effect transistor, such as an N-channel metal oxide semiconductor field-effect transistor and the second switch 14 may comprise a second transistor or second field effect transistor, such as a P-channel metal oxide semiconductor field-effect transistor or another metal oxide semiconductor field-effect transistor with supporting circuitry. The switched terminals (12, 15) of the first switch 12 are coupled between electrical ground 34 (e.g., chassis ground) and a first test resistor 116. The switched terminals (17, 19) of the second switch 14 are coupled between electrical ground 34 (e.g., chassis ground) and a second test resistor 118. If the switch (12, 14) is semiconductor, the switched terminals may comprise the combination of an emitter and a collector, or the combination of a source and drain, for example.

In one configuration, first voltage sensor 16 is coupled to measure a primary voltage between a first terminal 41 (e.g., first direct current terminal, such as VDC+) and electrical ground 34, whereas a second voltage sensor 18 is coupled to measure a secondary voltage between a second terminal 43 (e.g., second direct current terminal, such as VDC−) and electrical ground 34. The first voltage sensor 16 comprises any device or circuit for sensing, measuring or evaluating the primary voltage or another voltage or related current. Similarly, the second voltage sensor 18 comprises any device or circuit for sensing, measuring or evaluating the secondary voltage or another voltage or related current. For example, the first voltage sensor 16, the second voltage sensor 18 or both may comprise one or more of the following: resistive network, a resistive voltage divider, a resistive bridge, an operational amplifier, or an operational amplifier that converts a detected voltage level to a corresponding current level.

In one embodiment, a data processing system 20 comprises an electronic data processor 22, a data storage device 26 and one or more data ports 32 coupled to a data bus 24. The data storage device 26 may store, retrieve, read and write one or more of the following items: a test switch module 28 and a measurement module 30. A module means software, electronics, or both.

The electronic data processor 22 may comprise a processor, a microcontroller, a digital signal processor, an application specific integrated circuit (ASIC), a programmable logic array, a programmable logic device, field programmable gate array (FPGA), a logic circuit, an arithmetic logic unit, a Boolean logic device, or another data processing device.

Each data port 32 may comprise a data transceiver, buffer memory 53, or both.

An optional user interface 45 can be coupled to the data bus 24 for communication with the data processor 22, data storage device 26, or data ports 32. The optional user interface 45 is indicated as optional by the dashed lines. The optional user interface 45 may comprise one or more of the following: a display, a touch screen display, a keypad, a keyboard, a control panel, a pointing device (e.g., electronic mouse), or another device for entry or output of data from the data processing system 20.

The data storage device 26 may comprise one or more of the following: electronic memory, nonvolatile electronic memory, an optical data storage device, a magnetic data storage device, or other device for storing digital or analog data.

An optional interface 47 may be coupled between the test circuit 40 and the data ports 32 of the data processor 22 system. For example, the optional interface 47 may be coupled between the first voltage sensor 16 and the second voltage sensor 18 and one or more data ports 32. In one configuration, the optional interface 47 comprises one or more of the following: an analog multiplexer 49, an analog-to-digital converter 51, and buffer memory 53. For example, an analog multiplexer 49 may comprise a group of operational amplifiers that combine multiple inputs into a single output via amplifiers, resistive voltage dividers, and input switches. The analog-to-digital converter 51 can convert the analog output signal of the multiplexer 49 to a digital data for temporary storage in the buffer memory 53, until the data ports 32 or data processor 22 can process the digital data. In one embodiment, the first voltage sensor 16 and the second voltage sensor 18 detect a primary voltage and secondary voltage, respectively, as analog signals that are converted to digital signals or digital data by the interface 47, where the digital data may be referred to as primary voltage data and secondary voltage data.

In accordance with one embodiment, a method of detecting a fault in a test circuit 40 or switch of a test circuit 40 comprises a test driver 10 for activating a first switch 12 of a test circuit 40, a second switch 14 of the test circuit 40, or both to provide an on state or an off state for each one of the switches for a plurality of time intervals. In a first state during a separate time interval, while the first switch 12 is in the on state and the second switch 14 is in the off state, a first voltage sensor 16 measures a (first state) primary voltage between a first terminal 41 of a tested device 36 and electrical ground 34 and a second voltage sensor measures a (first state) secondary voltage between a second terminal 43 (e.g., second direct current terminal) of the tested device 36 and electrical ground 34. In a second state during a discrete time interval, while the second switch 14 is the on state and the first switch 12 is in the off state, a first voltage sensor 16 measures a (second state) primary voltage between a first terminal 41 of a tested device 36 and electrical ground 34 and a second voltage sensor 18 measures a (second state) secondary voltage between a second terminal 43 (e.g., second direct current terminal) of the tested device 36 and electrical ground 34. In a third state during a compound time interval, while the first switch 12 and the second switch 14 are in on states, a first voltage sensor 16 measures a (third state) primary voltage between a first terminal 41 of a tested device 36 and electrical ground 34 and a second voltage sensor 18 measures a (third state) secondary voltage between a second terminal 43 (e.g., second direct current terminal) of the tested device 36 and electrical ground 34. In a fourth state during a supplemental time interval, while the first switch 12 and the second switch 14 are in off states, a first voltage sensor 16 measures a (fourth state) primary voltage between a first terminal 41 of a tested device 36 and electrical ground 34 and a second voltage sensor measures a (fourth state) secondary voltage between a second terminal 43 (e.g., second direct current terminal) of the tested device 36 and electrical ground 34. In a test state either the first switch 12 or the second switch 14 is in an on state. In a reference state both the first switch 12 and the second switch 14 are in on states, or both the first switch 12 and the second switch 14 are in off states.

In one embodiment, a data processor 22 is adapted to estimate an observed leakage resistance based on the measured primary voltages and secondary voltages of the first state and the second state. "Adapted to, configured to or arranged to" means that software instructions or modules are provided in or associated with the data storage device 26 to support execution of the software instructions or modules by the data processor 22. The data processor 22 is adapted to estimate a reference leakage resistance based on the measured primary voltages and secondary voltages of the third state. The data processor 22 is adapted to determine that the test circuit 40 (e.g., first switch 12 or the second switch 14) has failed (e.g., in a short circuit mode or open circuit mode across its switched terminals) if the observed leakage resistance (which is based on voltage measurements during the separate and distinct intervals) differs from the reference leakage resistance (which is based on measurements during at least the compound time interval) by more than a threshold amount.

In one embodiment, the following time intervals are separate from each other and do not overlap: separate time interval, distinct time interval, compound time interval and supplemental time interval. The test driver 10 can determine the order, sequence or permutations of each iteration or occurrence of a separate time interval, distinct time interval, compound time interval and supplemental time interval.

In FIG. 2 through FIG. 5, inclusive, the first switch 112 is analogous to first switch 12 of FIG. 1; the second switch 114 is analogous to the second switch 14 of FIG. 1. The first switch 112 and first switch 114 can represent any type of semiconductor switch, a transistor, a field effect transistor, a bipolar junction transistor, electromechanical relay, a reed relay or other switch. The capacitor 124 represents one possible electrical model or representation of the tested device that is coupled to the first terminal 41 and the second terminal 43. FIG. 2 through FIG. 5, inclusive, provides a first leakage resistance, $R_{leakp}$, 120 that is an indicator of the isolation between the first terminal 41 and electrical ground 34; a second leakage resistance, $R_{leakp}$, 120 is an indicator of the isolation between the first terminal 41 and electrical ground 34. Like reference numbers in FIG. 1 through FIG. 5 indicate like elements.

FIG. 2 is one embodiment of a schematic for a test circuit 40 that shows a first state or separate time interval where a first switch 112 is on and a second switch 114 is off. The first resistor 116, $R_{tp}$, is coupled between one switched terminal 13 (e.g., drain, collector or equivalent terminal) of the first switch 112 and the first terminal 41. The second resistor 118, $R_{tn}$, is coupled between one switch terminal 18 (e.g., drain, collector or equivalent terminal) of the second switch 114 and the second terminal 43. The other resistances shown in FIG. 2 represent leakage resistances, such as a primary leakage resistance, $R_{leakp}$, 120 and a secondary leakage resistance, $R_{leakn}$, 122. The leakage resistances do not represent physical resistors as discrete devices or integrated circuits (e.g., semiconductors) of the test circuit 40, but rather the degree or extent of isolation between the terminals (41, 43) of the tested device 36 and electrical ground 34. The capacitor 124 represents the voltage potential (e.g., direct current voltage potential) between the first terminal 41 and the second terminal 43 of the tested device 36. The electrical ground 34 may comprise chassis ground or another electrical ground, such as the body of a vehicle, or the engine or drive train of the vehicle. For example, the first terminal 41 and the second terminal 43 of the tested device 36 are designed to float with respect to the electrical ground 34 or to maintain sufficient or adequate isolation between the electrical ground 34 and each one of the electrical terminals. In the first state, the (first state) primary voltage is indicated as $V_{P1}$ and the (first state) secondary voltage is indicated as $V_{N1}$.

FIG. 3 is one embodiment of a schematic for a test circuit 40 that shows a second state or a discrete time interval where a first switch 112 is off and a second switch 114 is on. Like reference numbers in FIG. 2 and FIG. 3 indicate like elements. In the second state, the (second state) primary voltage is indicated as $V_{P2}$ and the (second state) secondary voltage is indicated as $V_{N2}$.

Figure 4:
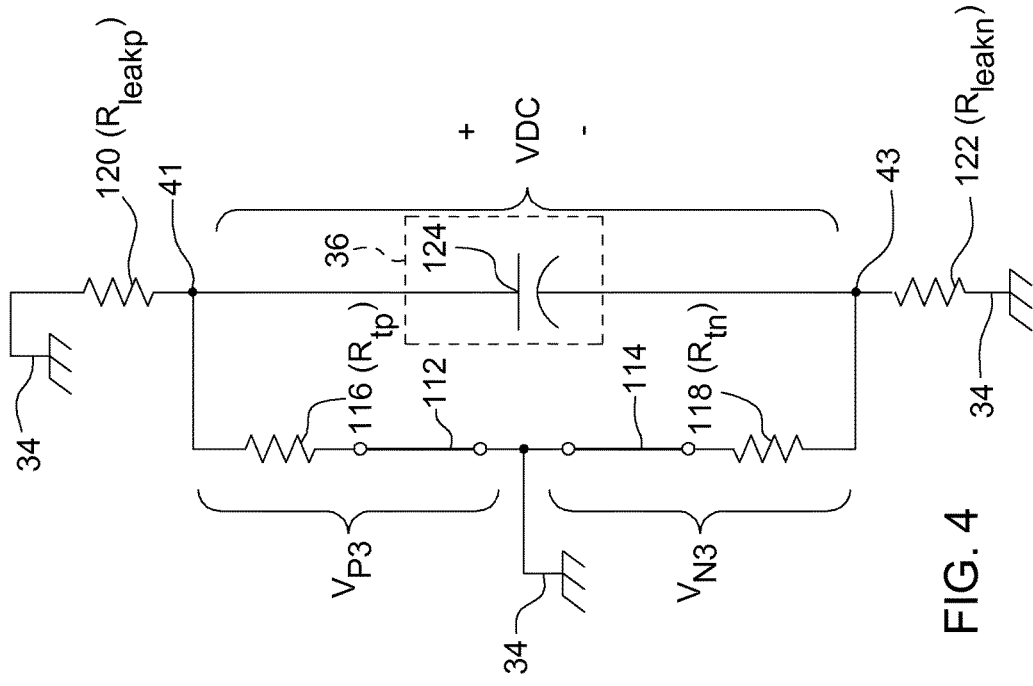

FIG. 4 is one embodiment of a schematic for a test circuit 40 that shows a third state or a compound time interval where a first switch 112 is on and a second switch 114 is on. Like reference numbers in FIG. 2 and FIG. 4 indicates like elements. In the third state, the (third state) primary voltage is indicated as $V_{P3}$ and the (third state) secondary voltage is indicated as $V_{N3}$.

Figure 5:
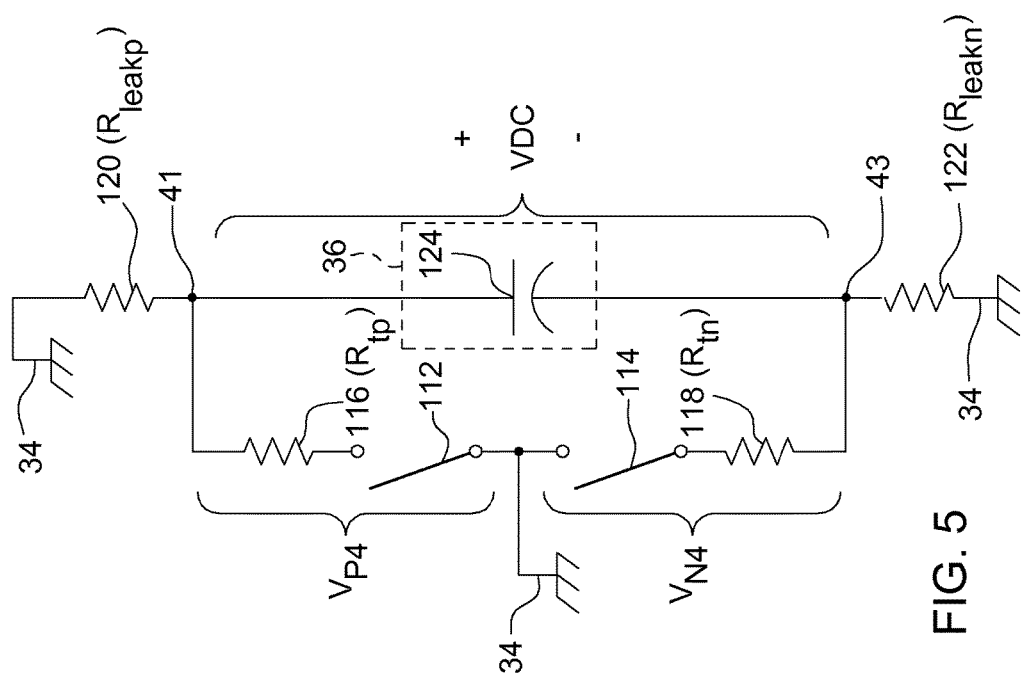
FIG. 5 is one embodiment of a schematic for a test circuit that shows a fourth state or an supplemental time interval where a first switch is off and a second switch is off.

FIG. 5 is one embodiment of a schematic for a test circuit 40 that shows a fourth state or an supplemental time interval where a first switch 112 is off and a second switch 114 is off. Like reference numbers in FIG. 2 and FIG. 5 indicates like elements. In the fourth state, the (fourth state) primary voltage is indicated as $V_{P4}$ and the (fourth state) secondary voltage is indicated as $V_{N4}$.

Figure 6:
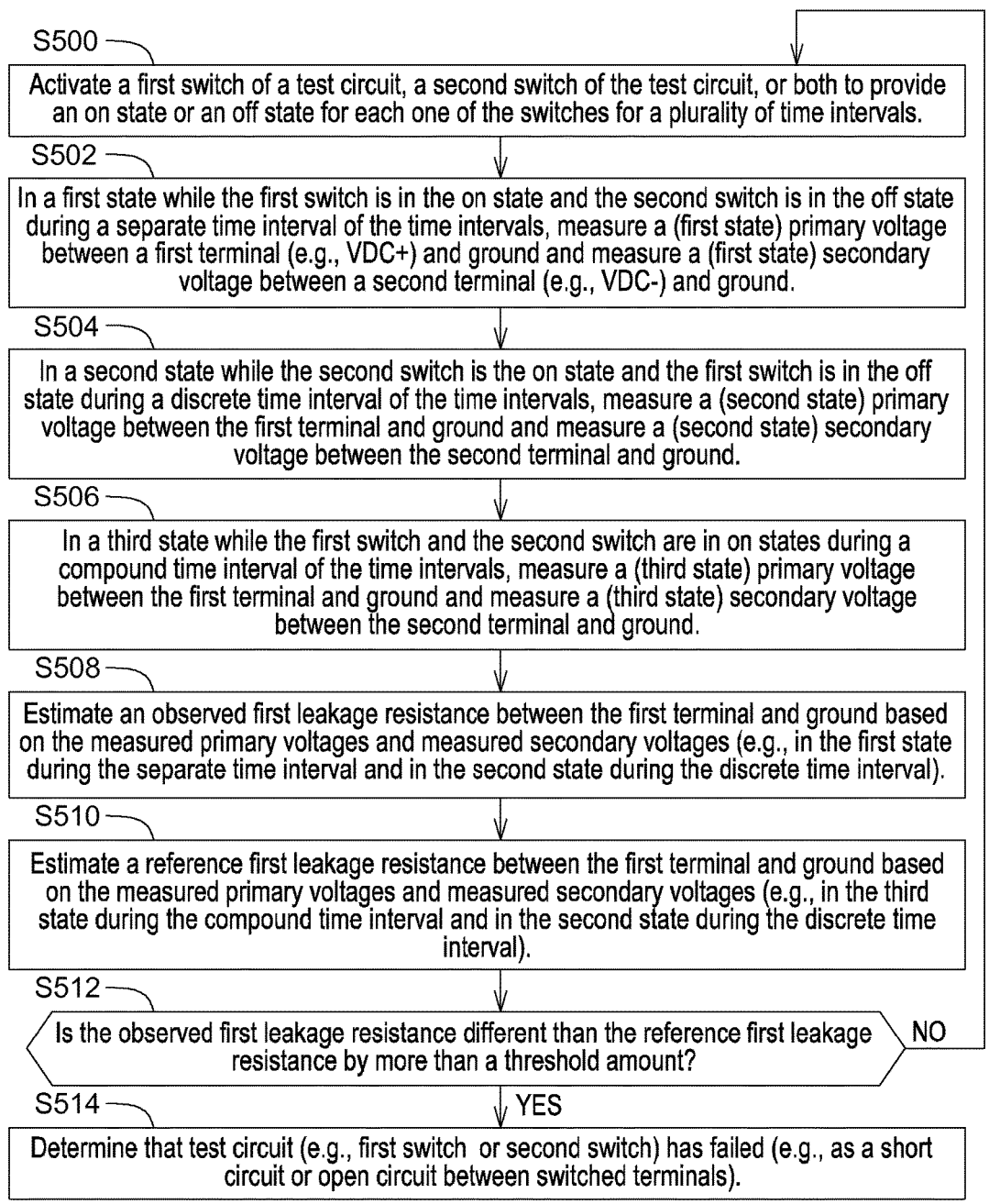
FIG. 6 is one embodiment of a flow chart for monitoring electrical isolation, such isolation between a terminal of a tested device and electrical ground, where faults in the test circuit can be detected reliably.

FIG. 6 is one embodiment of a flow chart for monitoring electrical isolation, such isolation between a terminal of the tested device 36 and electrical ground 34, where faults in the test circuit 40 can be detected reliably. The method can be used to detecting a fault in a test circuit 40, such as a fault in a switch (12, 112, 14, 114) of a test circuit 40, or a fault in first resistor 116 or second resistor 118 of the test circuit 40. The method begins in step S500.

In step S500, a test circuit 40 or a test driver 10 activates a first switch (12, 112) of a test circuit 40, a second switch (14, 114) of the test circuit 40, or both to provide a combination of an on-state or an off-state for each one of the switches for a plurality of time intervals. For example, each time interval may be associated with a corresponding state of the switches. In a first state the first switch (12, 112) is on and the second switch (14, 114) is off; in the second state the first switch (12, 112) is off and the second switch (14, 114) is on; in the third state both the first switch (12, 112) and the second switch (14, 114) are on simultaneously. In an alternate embodiment, the third state may be replaced by or supplemented by an alternate state or fourth state in which both the first switch (12, 112) and the second switch (14, 114) are off simultaneously. The test circuit 40 or test driver 10 may control or activate the first switch (12, 112) and the second switch (14, 114) in any sequence, order or permutation of the first state, the second state, or the third state, for example. Similarly, the test circuit 40 or test driver 10 may control or activate the first switch (12, 112) and the second switch (14, 114) in any sequence, order or permutation of the first state, the second state and fourth state. The test circuit 40 or test driver 10 can also establish one or more time intervals in which any of the above states exists, persists or is active, or inactive.

In step S502, in the first state during a separate time interval (e.g., first time interval of the time intervals) while the first switch (12, 112) is in the on-state and the second switch (14, 114) is in the off-state, a first voltage sensor 16 measures a (first state) primary voltage between a first terminal 41 (e.g., first direct current terminal) of a tested device 36 and electrical ground 34 and a second voltage sensor 18 measures a (first state) secondary voltage between a second terminal 43 (e.g., second direct current terminal) of the tested device 36 and electrical ground 34 (e.g., chassis ground). In one embodiment, a (first state) primary voltage and the (first state) secondary voltage are indicative of leakage resistance between a second terminal 43 and electrical ground 34 (e.g., chassis ground). In one embodiment, first terminal 41 has a first polarity (e.g., positive polarity, such as VDC+); the second terminal 43 has a second polarity (e.g., negative polarity, such as VDC−) opposite of the first polarity. In some embodiments, the first terminal 41 may comprise a first direct current terminal and the second terminal 43 may comprise a second direct current terminal.

In an alternate embodiment of step S502, during one or more separate time intervals a first voltage sensor 16 measures a (first state) primary voltage between a first terminal 41 of a tested device 36 and electrical ground 34 and the data processor 22 averages (e.g., takes the mean, mode, or median of) the measured primary voltages over a time period (e.g., including multiple separate time intervals) to provide a measured primary voltage for the first state. Similarly, in the alternate embodiment of step S502 during one or more separate time intervals, a second voltage sensor 18 measures a (first state) secondary voltage between a second terminal 43 of the tested device 36 and electrical ground 34 and the data processor 22 averages (e.g., takes the mean, mode, or median of) the measured secondary voltages over the time period to provide a measured secondary voltage for the first state. Further, for its later use, the data processor 22 may store in the data storage device 26 the averaged values of measured primary voltages and secondary voltages for the first state; the stored averaged values may be used instead of or in combination with dynamically measured values of the primary voltage and secondary voltage for the first state.

In step S504, in the second state during a discrete time interval (e.g., second time interval of the time intervals) while the second switch (14, 114) is the on-state and the first switch (12, 112) is in the off-state, a first voltage sensor 16 measures a (second state) primary voltage between a first terminal 41 (e.g., first direct current terminal) of a tested device 36 and electrical ground 34 and a second voltage sensor 18 measures a (second state) secondary voltage between a second terminal 43 (e.g., second direct current terminal) of the tested device 36 and electrical ground 34 (e.g., chassis ground). In one embodiment, a (second state) primary voltage and the (second state) secondary voltage are indicative of leakage resistance between a first terminal 41 to chassis or electrical ground 34.

In an alternate embodiment of step S504, during one or more discrete time intervals a first voltage sensor 16 measures a (second state) primary voltage between a first terminal 41 of a tested device 36 and electrical ground 34 and the data processor 22 averages (e.g., takes the mean, mode, or median of) the measured primary voltages over a time period (e.g., including multiple discrete time intervals) to provide a measured primary voltage for the second state. Similarly, in the alternate embodiment of step S504 during one or more separate time intervals, a second voltage sensor 18 measures a (second state) secondary voltage between a second terminal 43 of the tested device 36 and electrical ground 34 and the data processor averages (e.g., takes the mean, mode, or median of) the measured secondary voltages over the time period to provide a measured secondary voltage for the second state. Further, for its later use, the data processor 22 may store in the data storage device 26 the averaged values of measured primary voltages and secondary voltages for the second state; the stored averaged values may be used instead of or in combination with dynamically measured values of the primary voltage and secondary voltage for the second state.

In step S506, in a third state during a compound time interval (e.g., third time interval of the time intervals) while the first switch (12, 112) and the second switch (14, 114) are in on states, a first voltage sensor 16 measures a (third state) primary voltage between a first terminal 41 (e.g., first direct current terminal) of a tested device 36 and electrical ground 34 and a second voltage sensor 18 measures a (third state) secondary voltage between a second terminal 43 (e.g., second direct current terminal) of the tested device 36 and electrical ground 34.

In an alternate embodiment of step S506, during one or more compound time intervals a first voltage sensor 16 measures a (third state) primary voltage between a first terminal 41 of a tested device 36 and electrical ground 34 and the data processor 22 averages (e.g., takes the mean, mode, or median of) the measured primary voltages over a time period (e.g., including multiple compound time intervals) to provide a measured primary voltage for the third state. Similarly, in the alternate embodiment of step S504 during one or more compound time intervals, a second voltage sensor 18 measures a (third state) secondary voltage between a second terminal 43 of the tested device 36 and electrical ground 34 and the data processor averages (e.g., takes the mean, mode, or median of) the measured secondary voltages over the time period to provide a measured secondary voltage for the third state. Further, for its later use, the data processor 22 may store in the data storage device 26 the averaged values of measured primary voltages and secondary voltages for the third state; the stored averaged values may be used instead of or in combination with dynamically measured values of the primary voltage and secondary voltage for the third state.

In step S508, a data processor 22 estimates an observed first leakage resistance between the first terminal 41 and electrical ground 34 based on the measured primary voltage and the measured secondary voltages (e.g., in the first state during the separate time interval and in the second state during the discrete time interval). Step S508 may be executed in accordance with various procedures that may be executed separately or cumulatively. Under a first procedure, the data processor 22 determines the primary leakage resistance ($R_{leakp}$) in accordance with the following equation:

$$R_{leakp} = \frac{R_{tp}R_{tn}(V_{P2}V_{N1} - V_{P1}V_{N2})}{V_{N2}(V_{N1}R_{tp} + V_{P1}R_{tn})}$$

where $V_{P1}$ is a primary voltage of the first state measured at or during a separate time interval (e.g., first time interval), $V_{N1}$ is a secondary voltage of the first state measured at or during a separate time interval (e.g., first time interval), $V_{P2}$ is the primary voltage of the second state measured at or during a discrete time interval (e.g., second time interval), $V_{N2}$ is a secondary voltage of the first state measured at or during a discrete time interval (e.g., second time interval), $R_{tp}$ is a resistance value of the first resistor 116, and $R_{tn}$ is a resistance value of the second resistor 118.

Under a second procedure, the data processor 22 determines the primary leakage resistance based on any of the following: the measured primary voltage in the first state during the separate time interval, the measured primary voltage in the second state during the discrete time interval, the measured secondary voltage in the first date during the separate time interval, the measured secondary voltage in the second state during the discrete time interval, where the separate time interval and the distinct time interval occur at different times with respect to each other and in any sequential order.

In step S510, the data processor 22 estimates a reference first leakage resistance between the first terminal 41 and ground 34 based on the measured primary voltages and measured secondary voltages (e.g., in the third state during the compound time interval and in the second state during the discrete time interval). Step S510 may be executed in accordance with various procedures that may be executed separately or cumulatively. Under a first procedure, the data processor 22 determines the primary leakage resistance ($R_{leakp}$) in accordance with the following equation:

$$R_{leakp} = \frac{R_{tp}(V_{N3}V_{P2} - V_{N2}V_{P3})}{V_{N2}V_{P3}}$$

where $V_{P3}$ is a primary voltage of the third state measured at or during a compound time interval (e.g., third time interval), $V_{N3}$ is a secondary voltage of the third state measured at or during a compound time interval (e.g., third time interval), $V_{P2}$ is the primary voltage of the second state measured at or during a discrete time interval (e.g., second time interval), $V_{N2}$ is a secondary voltage of the first state measured at or during a discrete time interval (e.g., second time interval), and $R_{tp}$ is a resistance value of the first resistor 116.

Under a second procedure, the data processor 22 estimates a reference first leakage resistance between the first terminal 41 and ground 34 based on the measured primary voltages and measured secondary voltages in the third state during the compound time interval and based on measured primary and secondary voltages in the second state during the discrete time interval, where the compound time interval and the distinct time interval occur at different times with respect to each other and in any sequential order.

In step S512, the data processor 22 determines whether the observed first leakage resistance is different than the reference first leakage resistance by more than a threshold amount. In one embodiment, the threshold amount is approximately fifty-percent (50%) of the reference leakage resistance, although other threshold amounts may be used in practice. Approximately means a tolerance of plus or minus ten percent of a value. If the data processor 22 determines that the observed first leakage resistance is not different than the reference first leakage resistance by more than the threshold amount, the method continues with step S500 (e.g., after waiting a time interval). For example, if the observed first leakage resistance is within a maximum tolerance of or limit of the reference first leakage resistance, the test circuit 40 and the first switch (12, 112) and second switch (14, 114) are regarded as functioning normally. If the data processor 22 determines that the observed first leakage resistance is different than the reference first leakage resistance by more than a threshold amount, the method continues with step S514.

In step S514, the data processor 22 determines that a test circuit 40 (e.g., first switch (12, 112) or second switch (14, 114)) has failed (e.g., as a short circuit or open circuit between switched terminals). For example, the data processor 22 may generate an alert message (e.g., audible, visual, or both) for presentation via the user interface 45 (e.g., its display) to an operator that the test circuit 40 has failed, or that one or more switches (12, 14, 112, 114) of the test circuit 40 have failed. If the observed leakage resistance and reference leakage resistance are not equal or within a certain tolerance of equal (e.g., plus or minus fifty percent of the reference leakage resistance), then one or more of the switches have failed, in failure mode with open switched terminals, closed switched terminals, or both.

In alternate embodiments of step S514, the data processor 22 may comprise a diagnostic module with logic, computer instructions, files, data records, or a database to identify the failure mode (e.g., short circuit or open circuit) and particular failed switch (e.g., first switch, second switch (14, 114), or both). For instance, the diagnostic module may comprise a look-up table stored in the data storage device 26 that defines relationships between or among one or more of the following items: (1) observed leakage resistances, (2) reference leakage resistance, (3) ranges of observed leakage resistances, (4) ranges of reference leakage resistance, (5) switch failure modes, (6) short-circuit switch failure modes, (7) open-circuit switch failure modes, and (8) switch identifiers, such as first switch or second switch (14, 114).

Figure 7:
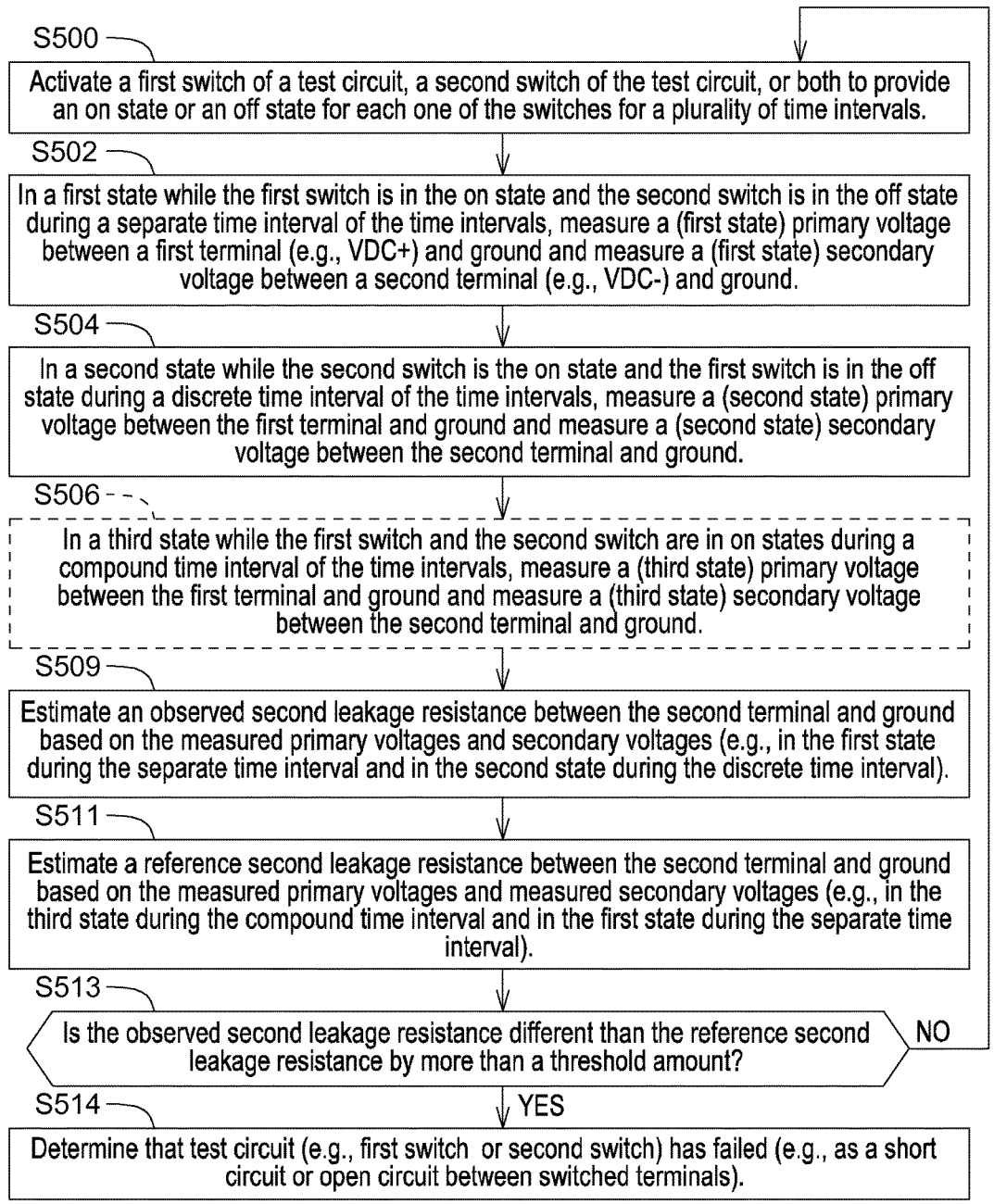
FIG. 7 is another embodiment of a flow chart for monitoring electrical isolation of a tested device.

The method of FIG. 7 is similar to the method of FIG. 6, except the method of FIG. 7 replaces steps S508, S510 and S512 with steps S509, S511 and S513, respectively. Like reference numbers in FIG. 6 and FIG. 7 indicate like steps or procedures.

In step S509, a data processor 22 estimates an observed second leakage resistance between the second terminal 43 and ground 34 based on the measured primary voltages and secondary voltages (e.g., in the first state during the separate time interval and in the second state during the discrete time interval). Step S509 may be executed in accordance with various procedures that may be executed separately or cumulatively. Under a first procedure, the data processor 22 determines the secondary leakage resistance ($R_{leakn}$) in accordance with the following equation:

$$R_{leakn} = \frac{R_{tp}R_{tn}(V_{P2}V_{N1} - V_{N2}V_{P1})}{V_{P1}(V_{N2}R_{tp} + V_{P2}R_{tn})}$$

where $V_{P1}$ is a primary voltage of the first state measured at or during a separate time interval (e.g., first time interval), $V_{N1}$ is a secondary voltage of the first state measured at or during a separate time interval (e.g., first time interval), $V_{P2}$ is the primary voltage of the second state measured at or during a discrete time interval (e.g., second time interval), $V_{N2}$ is a secondary voltage of the first state measured at or during a discrete time interval (e.g., second time interval), $R_{tp}$ is a resistance value of the first resistor 116, and $R_{tn}$ is a resistance value of the second resistor 118.

Under a second procedure, the data processor 22 determines the secondary leakage resistance based on any of the following: the measured primary voltage in the first state during the separate time interval, the measured primary voltage in the second state during the discrete time interval, the measured secondary voltage in the first date during the separate time interval, the measured secondary voltage in the second state during the discrete time interval, where the separate time interval and the distinct time interval occur at different times with respect to each other and in any sequential order.

In step S511, a data processor 22 estimates a reference second leakage resistance between the second terminal 43 and ground 34 based on the measured primary voltages and measured secondary voltages (e.g., in the third state during the compound time interval and in the first state during the separate time interval). Step S511 may be executed in accordance with various procedures that may be executed separately or cumulatively. Under a first procedure, the data processor 22 determines the second leakage resistance ($R_{leakn}$) in accordance with the following equation:

$$R_{leakn} = \frac{R_{tn}(V_{N1}V_{P3} - V_{N3}V_{P1})}{V_{N3}V_{P1}}$$

where $V_{P3}$ is a primary voltage of the third state measured at or during a compound time interval (e.g., third time interval), $V_{N3}$ is a secondary voltage of the third state measured at or during a compound time interval (e.g., third time interval), $V_{P1}$ is a primary voltage of the first state measured at or during a separate time interval (e.g., first time interval), $V_{N1}$ is a secondary voltage of the first state measured at or during a separate time interval (e.g., first time interval), and $R_{tn}$ is the resistance of the second resistor 118.

Under a second procedure, the data processor 22 estimates a reference second leakage resistance between the first terminal 41 and ground 34 based on the measured primary voltages and measured secondary voltages in the third state during the compound time interval, and based on measured primary and measured secondary voltages in the first state during the separate time interval, where the compound time interval and the separate time interval occur at different times with respect to each other and in any sequential order.

In step S513, the data processor 22 determines whether the observed second leakage resistance is different than the reference second leakage resistance by more than a threshold amount. In one embodiment, the threshold amount is approximately fifty-percent (50%) of the reference leakage resistance. Approximately means a tolerance of plus or minus ten percent of a value. If the data processor 22 determines that the observed second leakage resistance is not different than the reference second leakage resistance by more than the threshold amount, the method continues with step S500 (e.g., after waiting a time interval). For example, if the observed first leakage resistance is within a maximum tolerance of or limit of the reference first leakage resistance, the test circuit 40 and the first switch (12, 112) and second switch (14, 114) are functioning normally. However, if the data processor 22 determines that the observed second leakage resistance is different than the reference second leakage resistance by more than a threshold amount, the method continues with step S514.

In step S514, the data processor 22 determines that a test circuit 40 (e.g., first switch (12, 112) or second switch (14, 114)) has failed (e.g., as a short circuit or open circuit between switched terminals). For example, the data processor 22 may generate an alert message (e.g., audible, visual, or both) for presentation via the user interface 45 (e.g., its display) to an operator that the test circuit 40 has failed, or that one or more switches (12, 14, 112, 114) of the test circuit 40 have failed. If the observed leakage resistance and reference leakage resistance are not equal or within a certain tolerance of equal (e.g., plus or minus fifty percent of the reference leakage resistance), then one or more of the switches have failed, in failure mode with open switched terminals, closed switched terminals, or both. In alternate embodiments, the data processor 22 may comprise a diagnostic module with logic, computer instructions, files, data records, or a database to identify the failure mode (e.g., short circuit or open circuit) and particular failed switch (e.g., first switch, second switch (14, 114), or both). For instance, the diagnostic module may comprise a look-up table stored in the data storage device 26 that defines relationships between or among one or more of the following items: (1) observed leakage resistances, (2) reference leakage resistance, (3) ranges of observed leakage resistances, (4) ranges of reference leakage resistance, (5) switch failure modes, (6) short-circuit switch failure modes, (7) open-circuit switch failure modes, and (8) switch identifiers, such as first switch or second switch (14, 114).

Figure 8:
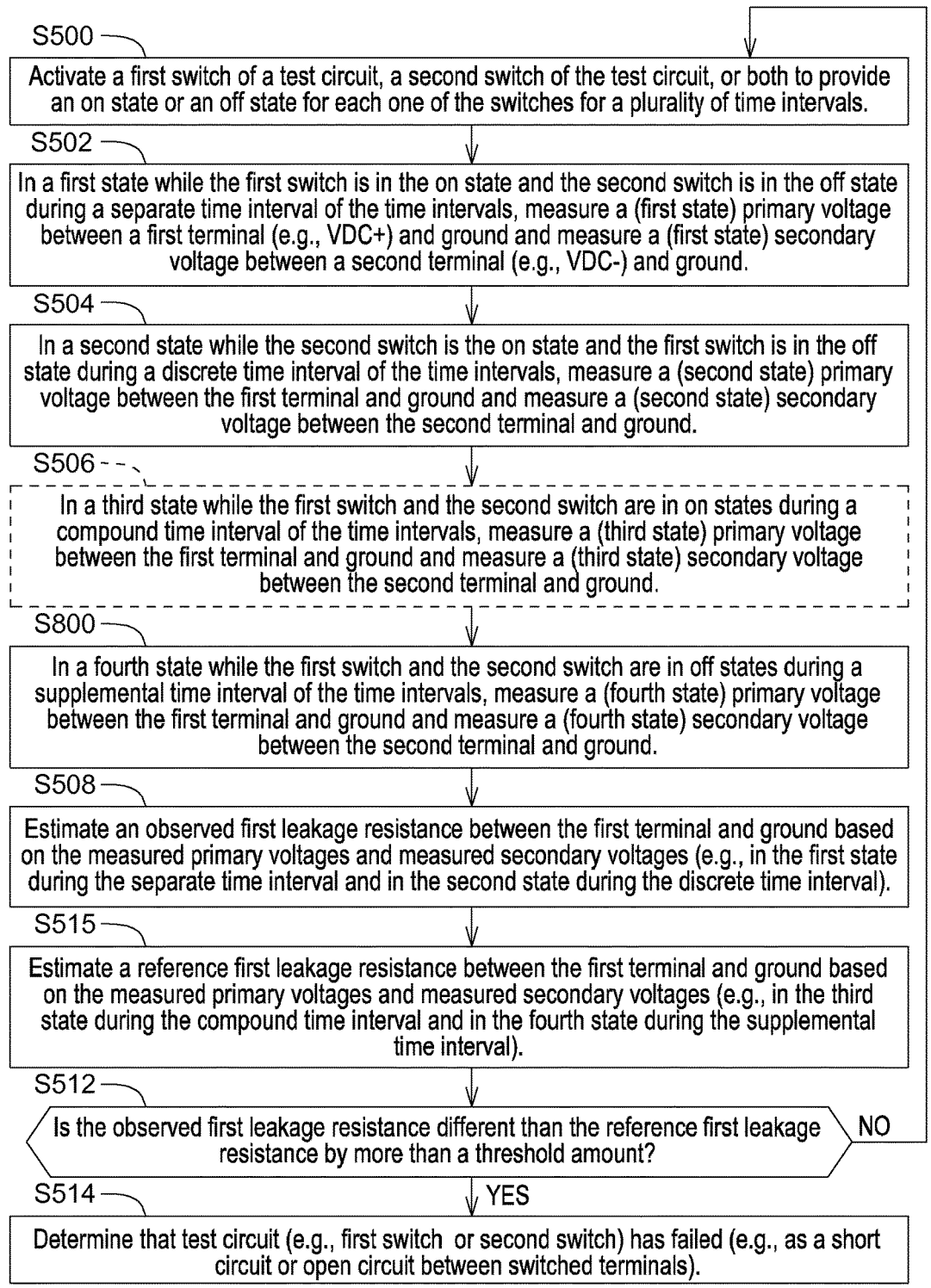
FIG. 8 is yet another embodiment of a flow chart for monitoring electrical isolation of a tested device.

The method of FIG. 8 is similar to the method of FIG. 6, except the method of FIG. 8: adds step S800, replaces step S510 with step S515, and makes step S506 optional or dependent upon which equation for leakage resistance is used in step S515. Like reference numbers in FIG. 6 and FIG. 8 indicate like steps or procedures.

In FIG. 8, the block for step S506 is indicated in dashed lines because step S506 is optional or dependent upon which leakage resistance equation or equations are used in step S515. For example, if the leakage resistance equation used in step S515 requires the measured primary voltages and measured secondary voltages in the third state during the compound time interval, then step S506 of FIG. 8 is required.

In step S800, in a fourth state while the first switch (12, 112) and the second switch (14, 114) are in off states during a supplemental time interval of the time intervals, the first voltage sensor 16 measures a (fourth state) primary voltage between the first terminal 41 and ground 34 and a second voltage sensor 18 measures a (fourth state) secondary voltage between the second terminal 43 and ground 34.

In step S515, a data processor 22 estimates a reference first leakage resistance between the first terminal 41 and ground 34 based on the measured primary voltages and measured secondary voltages (e.g., in the third state during the compound time interval and in the fourth state during the supplemental time interval). Step S515 may be executed in accordance with various procedures that may be executed separately or cumulatively. Under a first procedure, the data processor 22 determines the reference first leakage resistance ($R_{leakp}$) in accordance with the following equation:

$$R_{leakp} = \frac{R_{tn} R_{tp}(V_{P4} V_{N3} - V_{P3} V_{N4})}{V_{N4}(R_{tn} V_{P3} - R_{tp} V_{N3})}$$

where $V_{P3}$ is a primary voltage of the third state measured at or during a compound time interval (e.g., third time interval), $V_{N3}$ is a secondary voltage of the third state measured at or during a compound time interval (e.g., third time interval), $V_{P4}$ is a primary voltage of the fourth state measured at or during a supplemental time interval (e.g., fourth time interval), $V_{N4}$ is a secondary voltage of the fourth state measured at or during a supplemental time interval (e.g., fourth time interval), $R_{tp}$ is the resistance of the first resistor 116, and $R_{tn}$ is the resistance of the second resistor 118.

Under a second procedure, the data processor 22 determines the reference first leakage resistance based on the measured primary voltage in the third state during the compound time interval and in the fourth state during the supplemental time interval. Further, the data processor 22 determines the reference first leakage resistance based on the measured primary and secondary voltages in the third state during the compound time interval and based on the measured primary and secondary voltages in the fourth state during the supplemental time interval, where the compound time interval and the supplemental time interval occur at different times with respect to each other and in any sequential order.

Under a third procedure, the data processor 22 determines the reference first leakage resistance ($R_{leakp}$) in accordance with the following equation:

$$R_{leakp} = \frac{R_{tp}(V_{P4} V_{N1} - V_{P1} V_{N4})}{V_{P1} V_{N4}}$$

where $V_{P1}$ is a primary voltage of the first state measured at or during a separate time interval (e.g., first time interval), $V_{N1}$ is a secondary voltage of the first state measured at or during a separate time interval (e.g., first time interval), $V_{P4}$ is a primary voltage of the fourth state measured at or during a supplemental time interval (e.g., fourth time interval), $V_{N4}$ is a secondary voltage of the fourth state measured at or during a supplemental time interval (e.g., fourth time interval), and $R_{tp}$ is the resistance of the first resistor 116.

Under a fourth procedure, the data processor 22 determines the reference first leakage resistance based on the measured primary voltage in the first state during the separate time interval and in the fourth state during the supplemental time interval. Further, the data processor 22 determines the reference first leakage resistance based on the measured primary and secondary voltages in the first state during the separate time interval and based on the measured primary and secondary voltages in the fourth state during the supplemental time interval, where the separate time interval and the supplemental time interval occur at different times with respect to each other and in any sequential order.

Figure 9:
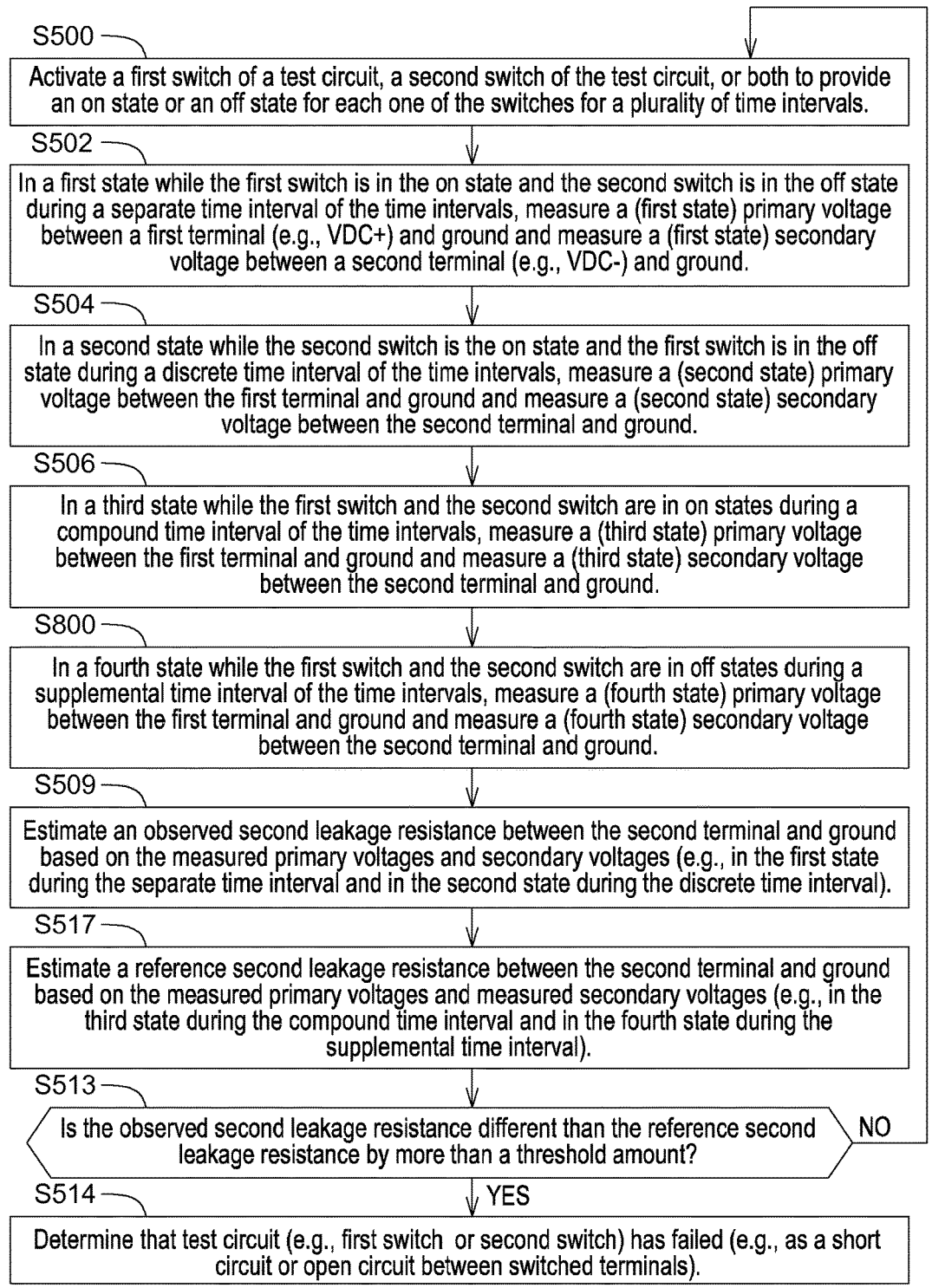
FIG. 9 is still another embodiment of a flow chart for monitoring electrical isolation of a tested device.

The method of FIG. 9 is similar to the method of FIG. 7, except the method of FIG. 9: adds step S800, replaces step S511 with step S517, and makes step S506 optional or dependent upon which equation or equations for leakage resistance is used in step S517. Like reference numbers in FIG. 7 and FIG. 9 indicate like steps or procedures.

In FIG. 9, the block for step S506 is indicated in dashed lines because step S506 is optional or dependent upon which leakage resistance equation or equations are used in step S517. For example, if the leakage resistance equation used in step S517 requires the measured primary voltages and measured secondary voltages in the third state during the compound time interval, then step S506 of FIG. 9 is required.

In step S800, in a fourth state while the first switch (12, 112) and the second switch (14, 114) are in off states during a supplemental time interval of the time intervals, the first voltage sensor 16 measures a (fourth state) primary voltage between the first terminal 41 and ground 34 and a second voltage 18 sensor measures a (fourth state) secondary voltage between the second terminal 43 and ground 34.

In step S517, a data processor 22 estimates a reference second leakage resistance between the first terminal 41 and ground 34 based on the measured primary voltages and measured secondary voltages (e.g., in the third state during the compound time interval and in the fourth state during the supplemental time interval). Step S517 may be executed in accordance with various procedures that may be executed separately or cumulatively. Under a first procedure, the data processor 22 determines the second leakage resistance ($R_{leakn}$) in accordance with the following equation:

$$R_{leakn} = \frac{R_{tn}R_{tp}(V_{P4}V_{N3} - V_{P3}V_{N4})}{V_{P4}(R_{tn}V_{P3} - R_{tp}V_{N3})}$$

where $V_{P3}$ is a primary voltage of the third state measured at or during a compound time interval (e.g., third time interval), $V_{N3}$ is a secondary voltage of the third state measured at or during a compound time interval (e.g., third time interval), $V_{P4}$ is a primary voltage of the fourth state measured at or during a supplemental time interval (e.g., fourth time interval), $V_{N4}$ is a secondary voltage of the fourth state measured at or during a supplemental time interval (e.g., fourth time interval), $R_{tp}$ is the resistance of the first resistor 116, and $R_{tn}$ is the resistance of the second resistor 118.

Under a second procedure, the data processor 22 determines the reference second leakage resistance based on the measured primary voltage in the third state during the compound time interval and in the fourth state during the supplemental time interval. Further, the data processor 22 determines the reference second leakage resistance based on the measured secondary voltage in the third state during the compound time interval and in the fourth state during the supplemental time interval, where the compound time interval and the supplemental time interval occur at different times with respect to each other and in any sequential order.

Under a third procedure, the data processor 22 determines the second leakage resistance ($R_{leakn}$) in accordance with the following equation:

$$R_{leakn} = \frac{R_{tn}(V_{P2}V_{N4} - V_{P4}V_{N2})}{V_{P4}V_{N2}}$$

where $V_{P2}$ is a primary voltage of the second state measured at or during a discrete time interval (e.g., second time interval), $V_{N2}$ is a secondary voltage of the second state measured at or during a discrete time interval (e.g., second time interval), $V_{P4}$ is a primary voltage of the fourth state measured at or during a supplemental time interval (e.g., fourth time interval), $V_{N4}$ is a secondary voltage of the fourth state measured at or during a supplemental time interval (e.g., fourth time interval), and $R_{tn}$ is the resistance of the second resistor 118.

Under a fourth procedure, the data processor 22 determines the reference second leakage resistance based on the measured primary voltage in the second state during the discrete time interval and in the fourth state during the supplemental time interval. Further, the data processor 22 determines the reference second leakage resistance based on the measured secondary voltage in the second state during the discrete time interval and in the fourth state during the supplemental time interval, where the discrete time interval and the supplemental time interval occur at different times with respect to each other and in any sequential order.

The method and system of this disclosure is well-suited for providing a self-test mechanism for the switches (e.g., first switch and second switch (14, 114)) of a test circuit for evaluating or monitoring electrical isolation between a direct current terminal and electrical ground. For example, the method and system of this disclosure can be used as part of plan to conform to International Electrotechnical Commission (IEC) standard IEC 61557-1, entitled "Electrical safety in low voltage distribution systems up to 1 000 V a.c. and 1 500 V d.c.—Equipment for testing, measuring or monitoring of protective measures—Part 1: General requirements." The method and system of this disclosure can support improved accuracy and reliability of estimation or monitoring of electrical isolation where leakage resistance equations or calculations are used to discern between switch failure (e.g., of the first switch or second switch (14, 114) of the test circuit) or true leakage resistance values (e.g., to determine reliably the presence or lack of electrical isolation). The method and system of this disclosure uses calculations of leakage resistances, rather than mere voltage measurements, to distinguish more accurately between insufficient electrical isolation and a problem in the test circuit that detects such isolation; calculations of leakage resistances by the data processor are typically quick and support adequate resolution for reliable differentiation, between electrical isolation and a problem in the test circuit, over a broad range of leakage resistances (e.g., approximately 2 Kilo-ohms to 2 Mega-ohms). The method and system of this disclosure can support effective, reliable detection of a switch failure even where one switch fails in an open state with a wide range of possible leakage resistances (e.g., approximately 2 Kilo-ohms to 2 Mega-ohms) associated with the other switch.

Having described the preferred embodiment, it will become apparent that various modifications can be made without departing from the scope of the invention as defined in the accompanying claims.

The following is claimed:

1. A method for monitoring electrical isolation of a tested device by a test circuit, the method comprising:
   activating a first switch of a test circuit, a second switch of the test circuit, or both to provide an on state or an off state for each one of the switches for a plurality of time intervals;
   in a first state while the first switch is in the on state and the second switch is in the off state, during a separate time interval among the time intervals, measuring a primary voltage between a first terminal to electrical ground;
   in a second state while the second switch is the on state and the first switch is in the off state, during a discrete time interval of the time intervals, measuring a secondary voltage between a second terminal to the electrical ground;
   in a third state while the first switch and the second switch are in on states, during a compound time interval of the time intervals, measuring the primary voltage and the secondary voltage;
   estimating an observed leakage resistance based on the measured primary voltages and secondary voltages of the first state and the second state;
   estimating a reference leakage resistance based on the measured primary voltages and the measured secondary voltages of the third state; and
   determining that the test circuit has failed if the observed leakage resistance differs from the reference leakage resistance by more than a threshold amount, where the observed leakage resistance is based on voltage measurements during the separate and distinct time intervals and where the reference leakage resistance is based on voltage measurements during at least the compound time interval that does not temporally overlap with the separate and distinct time intervals.

2. The method according to claim 1 wherein estimating an observed leakage resistance comprises:
   measuring the secondary voltage in the first state during the separate time interval;
   measuring the primary voltage in the second state during the discrete time interval; and
   estimating an observed first leakage resistance between the first terminal and the electrical ground based on the measured primary voltages and measured secondary voltages in the first state during the separate time interval and in the second state during the discrete time interval.

3. The method according to claim 2 wherein estimating a reference leakage resistance comprises:
   estimating a reference first leakage resistance between the first terminal and the electrical ground based on the measured primary voltages and measured secondary voltages in the third state during the compound time interval and in the second state during the discrete time interval.

4. The method according to claim 3 wherein determining that the test circuit has failed comprises:
   determining that the test circuit has failed if the observed first leakage resistance differs from the reference first leakage resistance by more than a threshold amount.

5. The method according to claim 1 wherein estimating an observed leakage resistance comprises:
   measuring the secondary voltage in the first state during the separate time interval;
   measuring the primary voltage in the second state during the discrete time interval; and
   estimating an observed second leakage resistance between the second terminal and the electrical ground based on the measured primary voltages and measured secondary voltages in the first state during the separate time interval and in the second state during the discrete time interval.

6. The method according to claim 5 wherein estimating a reference leakage resistance comprises:
   estimating a reference second leakage resistance between the second terminal and the electrical ground based on the measured primary voltages and measured secondary voltages in the third state during the compound time interval and in the second state during the discrete time interval.

7. The method according to claim 6 wherein determining that the test circuit has failed comprises:
   determining that the test circuit has failed if the observed second leakage resistance differs from the reference second leakage resistance by more than a threshold amount.

8. The method according to claim 1 wherein the separate time interval, the discrete time interval, and the compound interval occur in any order or permutation with respect to each other.

9. The method according to claim 1 wherein the threshold amount is approximately fifty-percent of the reference leakage resistance.

10. A method for monitoring electrical isolation of a tested device by a test circuit, the method comprising:
    activating a first switch of a test circuit, a second switch of the test circuit, or both to provide an on state or an off state for each one of the switches for a plurality of time intervals;
    in a first state while the first switch is in the on state and the second switch is in the off state, during a separate time interval among the time intervals, measuring a primary voltage between a first terminal to electrical ground;
    in a second state while the second switch is the on state and the first switch is in the off state, during a discrete time interval of the time intervals, measuring a secondary voltage between a second terminal to the electrical ground;
    in a third state while the first switch and the second switch are in on states, during a compound time interval of the time intervals, measuring the primary voltage and the secondary voltage;
    in a fourth state while the first switch and the second switch are in off states, during a supplemental time interval of the time intervals, measuring the primary voltage and the secondary voltage;

estimating an observed leakage resistance based on the measured primary voltages and secondary voltages of the first state and the second state;

estimating a reference leakage resistance based on the measured primary voltages and secondary voltages of the third state; and determining that the test circuit has failed if the observed leakage resistance differs from the reference leakage resistance by more than a threshold amount, where the observed leakage resistance is based on voltage measurements during the separate and distinct time intervals and where the reference leakage resistance is based on voltage measurements during at least the compound time interval that does not temporally overlap with the separate and distinct time intervals.

11. The method according to claim 10 wherein estimating an observed leakage resistance comprises:

measuring the secondary voltage in the first state during the separate time interval; and measuring the primary voltage in the second state during the discrete time interval;

estimating an observed first leakage resistance between the first terminal and the electrical ground based on the measured primary voltages and measured secondary voltages in the first state during the separate time interval and in the second state during the discrete time interval.

12. The method according to claim 11 wherein estimating a reference leakage resistance comprises:

estimating a reference first leakage resistance between the first terminal and the electrical ground based on the measured primary voltages and measured secondary voltages in the third state during the compound time interval and in the fourth state during the supplemental time interval.

13. The method according to claim 12 wherein determining that the test circuit has failed comprises:

determining that the test circuit has failed if the observed first leakage resistance differs from the reference first leakage resistance by more than a threshold amount.

14. The method according to claim 10 wherein estimating an observed leakage resistance comprises:

measuring the secondary voltages in the first state during the separate time interval;

measuring the primary voltages in the second state during the discrete time interval; and estimating an observed second leakage resistance between the second terminal and the electrical ground based on the measured primary voltages and measured secondary voltages in the first state during the separate time interval and in the second state during the discrete time interval.

15. The method according to claim 14 wherein estimating a reference leakage resistance comprises:

estimating a reference second leakage resistance between the second terminal and the electrical ground based on the measured primary voltages and measured secondary voltages in the third state during the compound time interval and in the fourth state during the supplemental time interval.

16. The method according to claim 15 wherein determining that the test circuit has failed comprises:

determining that the test circuit has failed if the observed second leakage resistance differs from the reference second leakage resistance by more than a threshold amount.

17. The method according to claim 10 wherein the separate time interval, the discrete time interval, and the compound time intervals occur in any order or permutation with respect to each other.

18. The method according to claim 10 wherein the threshold amount is approximately fifty-percent of the reference leakage resistance.

19. A system for monitoring electrical isolation of a tested device by a test circuit, the method comprising:

a first switch with its switched terminals coupled to electrical ground and a first resistor;

a second switch with its switched terminals coupled to electrical ground a second resistor;

a test driver for activating the first switch of a test circuit, the second switch of the test circuit, or both to provide an on state or an off state for each one of the switches for a plurality of time intervals in accordance with a first state, a second state, and a third state, where in a first state the first switch is in the on state and the second switch is in the off state, in the second state the second switch is the on state and the first switch is in the off state, in the third state the first switch is in the on state and the second switch is in the on state;

a first voltage sensor for measuring a primary voltage between a first terminal to electrical ground during the first state, the second state and the third state;

a second voltage sensor for measuring a secondary voltage between a second terminal to the electrical ground during the first state, the second state and third state;

an electronic data processor adapted to:

estimate an observed leakage resistance based on the measured primary voltages and secondary voltages of the first state and the second state;

estimate a reference leakage resistance based on the measured primary voltages and the measured secondary voltages of the third state; and determine that the test circuit has failed if the observed leakage resistance differs from the reference leakage resistance by more than a threshold amount, where the observed leakage resistance is based on voltage measurements during different time intervals, among the time intervals, that are separate, distinct and do not overlap temporally.

20. The system according to claim 19 wherein the threshold amount is approximately fifty-percent of the reference leakage resistance.

21. The system according to claim 19 further comprising:

the first voltage sensor and the second voltage sensor adapted to measure the primary voltage and the secondary voltage in a fourth state in which the first switch and the second switch are in off states;

the data processor adapted to estimate a reference leakage resistance between the first terminal and the electrical ground based on the measured primary voltages and measured secondary voltages in the third state during the compound time interval and in the fourth state during a supplemental time interval.

* * * * *